US006903390B2

(12) United States Patent
Amrilio et al.

(10) Patent No.: US 6,903,390 B2
(45) Date of Patent: Jun. 7, 2005

(54) SINGLE METAL PROGRAMMABILITY IN A CUSTOMIZABLE INTEGRATED CIRCUIT DEVICE

(75) Inventors: Lior Amrilio, Kiryat Ata (IL); Tomer Ben-Chen, Binyamina (IL); Uzi Yoeli, Haifa (IL)

(73) Assignee: Chip Express (Israel) Ltd., Haifa (IL)

( * ) Notice: Subject to any disclaimer, the term of this patent is extended or adjusted under 35 U.S.C. 154(b) by 0 days.

(21) Appl. No.: 10/416,144

(22) PCT Filed: Oct. 25, 2001

(86) PCT No.: PCT/IL01/00993

§ 371 (c)(1),
(2), (4) Date: Nov. 24, 2003

(87) PCT Pub. No.: WO02/39483

PCT Pub. Date: May 16, 2002

(65) Prior Publication Data

US 2004/0093577 A1 May 13, 2004

Related U.S. Application Data

(63) Continuation of application No. 09/707,762, filed on Nov. 7, 2000, now Pat. No. 6,459,136.

(51) Int. Cl.[7] .............................................. H01L 27/10
(52) U.S. Cl. ........................ 257/209; 257/208; 257/202
(58) Field of Search ................................ 257/202, 204, 257/254, 209, 208, 259

(56) References Cited

U.S. PATENT DOCUMENTS

| 4,240,094 A | 12/1980 | Mader ........................... 357/45 |
| 4,924,287 A | 5/1990 | Orbach et al. ................. 357/51 |
| 4,933,738 A | 6/1990 | Orbach et al. ................. 357/51 |
| 4,960,729 A | 10/1990 | Orbach et al. ............... 437/101 |
| 5,049,969 A | 9/1991 | Orbach et al. ................. 357/51 |
| 5,260,597 A | 11/1993 | Orbach et al. ............... 257/529 |
| 5,679,967 A | 10/1997 | Janai et al. .................. 257/209 |
| 5,742,181 A | 4/1998 | Rush ........................... 326/41 |
| 5,903,490 A | 5/1999 | Rotem et al. .................. 365/63 |
| 6,331,790 B1 | 12/2001 | Orbach et al. ................. 326/41 |
| 6,459,136 B1 | 10/2002 | Amarilio et al. ............. 257/529 |

FOREIGN PATENT DOCUMENTS

GB          1135992       12/1968

*Primary Examiner*—Brad Smith
(74) *Attorney, Agent, or Firm*—Ladas & Parry LLP

(57) ABSTRACT

A customizable integrated circuit including a substrate, a plurality of logic units formed on the substrate and a plurality of metal routing layers formed on the substrate for interconnecting the plurality of logic units. The plurality of metal routing layers includes a first routing layer including a plurality of elongate conductors extending generally in a given direction, a second routing layer including a plurality of transversely extending conductors, each adapted for interconnecting a termination of one of the plurality of elongate conductors to a beginning of another one of the plurality of elongate conductors and at least a third routing layer, including a plurality of local routing conductors, a plurality of customizable connections between pairs of the plurality of elongate conductors via individual ones of the plurality of transversely extending conductors and customizable connections between individual elongate conductors and a plurality of individual local routing conductors.

5 Claims, 6 Drawing Sheets

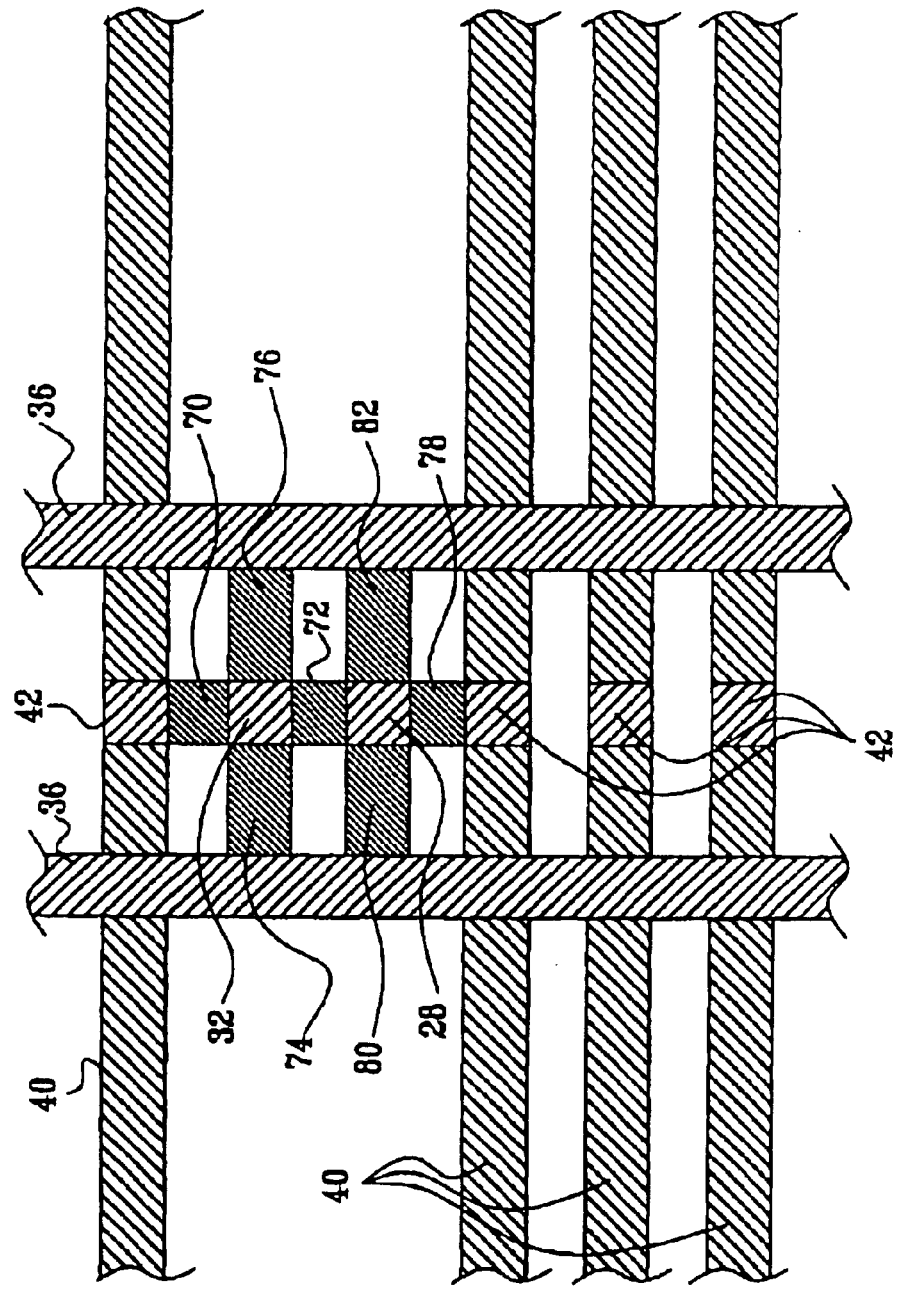

SINGLE METAL PROGRAMMABILITY IN A CUSTOMIZABLE INTEGRATED CIRCUIT DEVICE

This is a continuation of application Ser. No. 09/707,726 filed Nov. 7, 2000 now U.S. Pat. No. 6,459,136.

FIELD OF THE INVENTION

The present invention relates to integrated circuits generally and more particularly to customizable integrated circuits and methods of customizing same.

BACKGROUND OF THE INVENTION

Various types of customizable integrated circuits are known in the art. The following U.S. patents are believed to represent the state of the art: U.S. Pat. Nos. 5,903,490; 5,742,181; 5,679,967; 5,260,597; 5,049,969; 4,933,738; 4,960,729; 4,924,287; 4,240,094. Reference is also made to UK Patent 1135992 and to the various references appearing in the foregoing patents.

SUMMARY OF THE INVENTION

The present invention seeks to provide an improved customizable integrated circuit and method for customizing same.

There is thus provided in accordance with a preferred embodiment of the present invention a customizable integrated circuit including:

a substrate;

a plurality of logic units formed on the substrate; and a plurality of electrically conducting routing layers formed on the substrate for interconnecting the plurality of logic units, the plurality of electrically conducting routing layers including:

a first routing layer including a plurality of elongate conductors extending generally in a given direction;

a second routing layer including a plurality of transversely extending conductors, each adapted for interconnecting a termination of one of the plurality of elongate conductors to a beginning of another one of the plurality of elongate conductors; and at least a third routing layer including:

a plurality of local routing conductors;

a plurality of customizable connections between pairs of the plurality of elongate conductors via individual ones of the plurality of transversely extending conductors; and customizable connections between individual ones of the plurality of elongate conductors and a plurality of individual ones of the local routing conductors.

There is also provided in accordance with a preferred embodiment of the present invention a customizable integrated circuit including:

a substrate;

a plurality of logic units formed on the substrate; and a plurality of electrically conducting routing layers formed on the substrate for interconnecting the plurality of logic units, the plurality of electrically conducting routing layers including:

a first routing layer including a plurality of elongate conductors extending generally in a given direction;

a second routing layer including a plurality of transversely extending conductors, each adapted for interconnecting a termination of one of the plurality of elongate conductors to a beginning of another one of the plurality of elongate conductors; and at least a third routing layer including:

a plurality of customizable connections between pairs of the plurality of elongate conductors via individual ones of the plurality of transversely extending conductors, the plurality of customizable connections being arranged generally in at least one row.

The third routing layer may also include a plurality of customizable connections between individual ones of the plurality of elongate conductors and one of a ground line and a power supply line, whereby elongate conductors may serve as anti-crosstalk shields between adjacent other ones of the plurality of elongate conductors.

There is additionally provided in accordance with a preferred embodiment of the present invention a customizable integrated circuit including:

a substrate;

a plurality of logic units formed on the substrate; and a plurality of electrically conducting routing layers formed on the substrate for interconnecting the plurality of logic units, the plurality of electrically conducting routing layers including:

a first routing layer including a plurality of elongate conductors extending generally in a given direction;

a second routing layer including a plurality of transversely extending conductors, each adapted for interconnecting a termination of one of the plurality of elongate conductors to a beginning of another one of the plurality of elongate conductors; and a third routing layer including:

a plurality of customizable connections between individual ones of the plurality of elongate conductors and one of a ground line and a power supply line, whereby elongate conductors may serve as anti-crosstalk shields between adjacent other ones of the plurality of elongate conductors.

The first, second and third routing layers may or may not lie in respective sequential layers over the substrate.

The at least a third routing layer may include one or more routing layers.

Preferably, the at least a third routing layer includes:

a plurality of local routing conductors; and a plurality of customizable connections between pairs of the plurality of elongate conductors via individual ones of the plurality of transversely extending conductors.

BRIEF DESCRIPTION OF THE DRAWINGS

The present invention will be understood and appreciated more fully from the following detailed description, taken in conjunction with the drawings in which:

FIG. 4 is a simplified two dimensional illustration of a third routing layer showing possible customizable connections between various conductors.

DETAILED DESCRIPTION OF PREFERRED EMBODIMENTS

Figure 1:
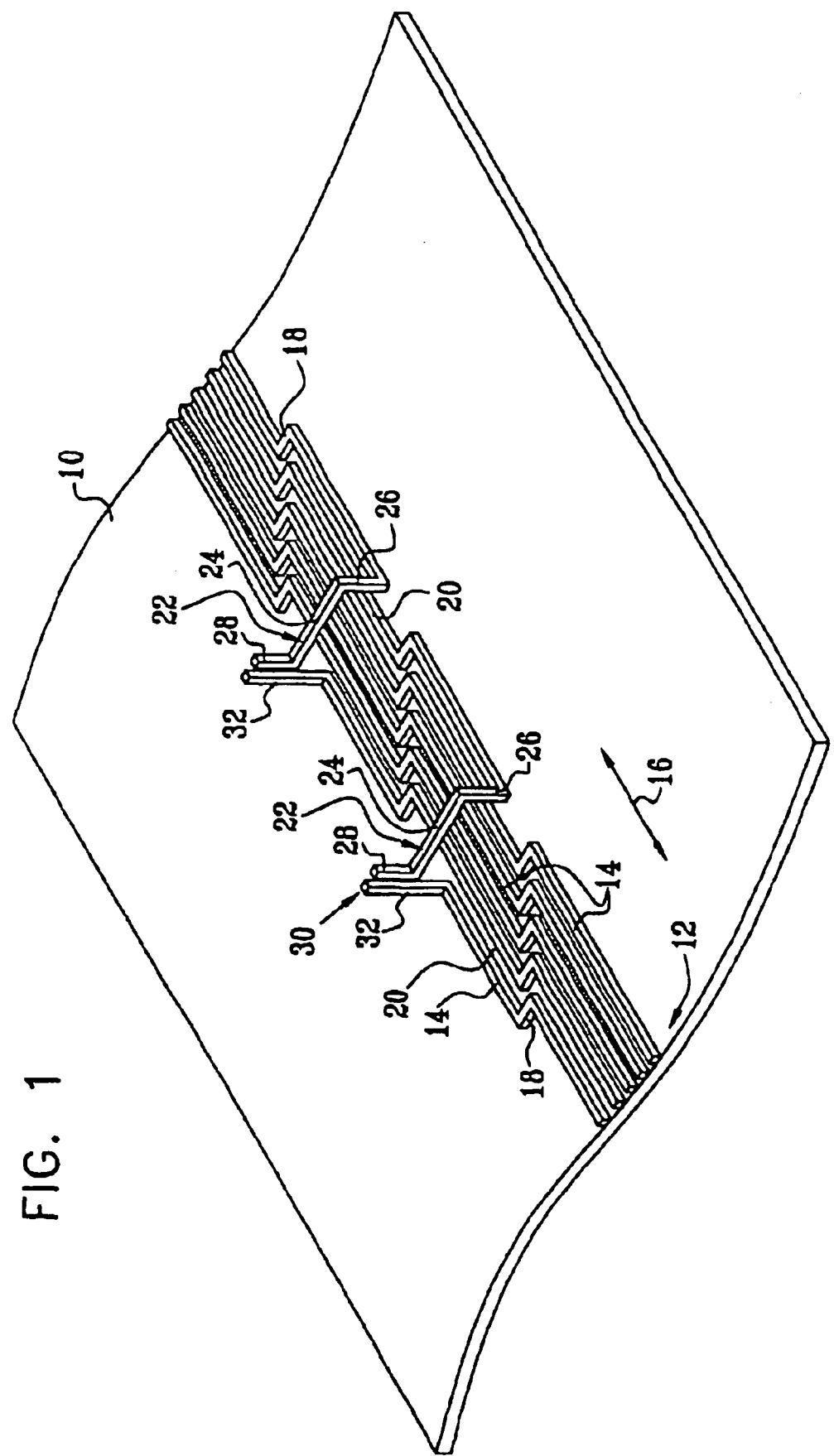
FIG. 1 is a simplified three-dimensional illustration of part of the structure of a customizable integrated circuit constructed and operative in accordance with a preferred embodiment of the present invention.

Reference is now made to FIG. 1, which is a simplified three-dimensional illustration of a repeated part of the structure of a customizable integrated circuit constructed and operative in accordance with a preferred embodiment of the present invention. As seen in FIG. 1, there is provided a customizable integrated circuit comprising a substrate 10, typically a silicon substrate onto which are formed a plurality of logic units (not shown).

A plurality of electrically conducting routing layers are formed on the substrate for interconnecting the plurality of logic units. The plurality of electrically conducting routing layers includes a first routing layer 12 including a plurality of elongate conductors 14 extending generally in a given orientation, indicated generally by arrows 16.

As seen in FIG. 1, the conductors 14 may be preferably arranged in a mutually nested stepped orientation wherein each elongate conductor 14 includes a plurality of short transverse portions 18, which interconnect elongated portions 20. Elongate portions 20 typically extend parallel to arrows 16, while transverse portions 18 extend perpendicularly to arrows 16 in the same plane as elongate portions 18.

A second routing layer 22, which may be placed above or below first routing layer 12, includes a plurality of transversely extending conductors 24, each adapted for interconnecting a termination of one of said plurality of elongate conductors 14 to a beginning of another one of said plurality of elongate conductors 14.

As seen in FIG. 1, each transversely extending conductor 24 is coupled at a first end thereof to an end of an elongate conductor 14 by a via 26 and is coupled at a second end thereof to a via 28, which extends to a third routing layer 30. In accordance with a preferred embodiment of the present invention, adjacent each via 28 is a via 32, extending from the third routing layer 30 to the first routing layer 12 and connecting to an end of an elongate conductor 14.

It is noted that the ends of vias 28 and 32 lie adjacent to each other in the third routing layer 30 and define a customizable connection between pairs of the plurality of elongate conductors 14 via individual ones of the plurality of transversely extending conductors 24. It is also noted that via pairs 28 and 32 are mutually spaced from each other along the directions indicated by arrows 16 typically by the length of elongate portions 20 and are typically arranged in a row extending parallel to the directions indicated by arrows 16.

Figure 2A:
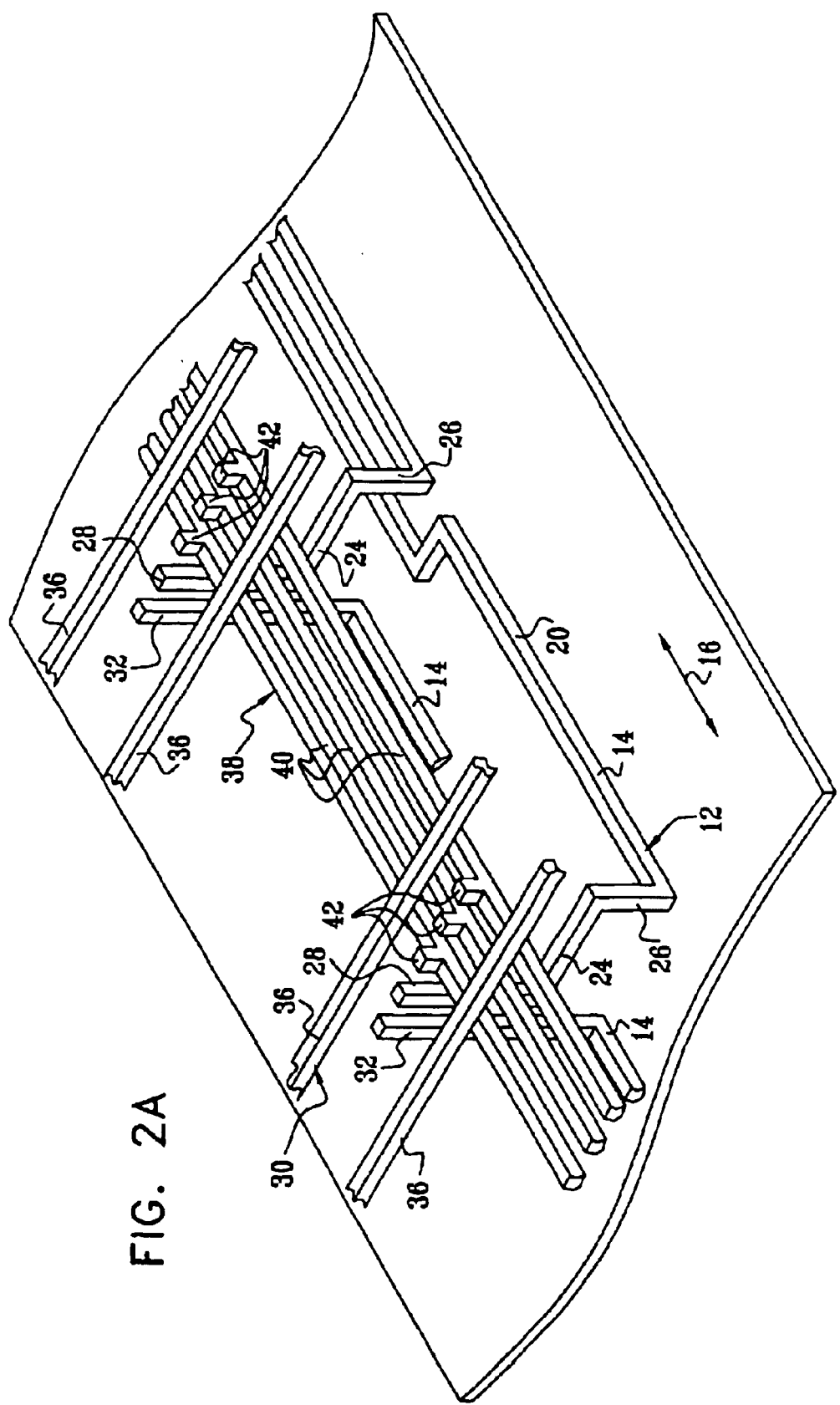
FIG. 2A is a simplified three-dimensional illustration of part of the structure of FIG. 1 with the addition of additional parts of the structure of a customizable integrated circuit constructed and operative in accordance with a preferred embodiment of the present invention.

Reference is now made to FIG. 2A, which is a simplified three-dimensional illustration of part of the structure of FIG. 1, which, for convenience is designated using the same reference numerals as used in FIG. 1, with the addition of additional parts of the structure of a customizable integrated circuit constructed and operative in accordance with a preferred embodiment of the present invention.

As seen in FIG. 2A, the third routing layer 30 includes a plurality of local routing conductors 36 which typically extend generally perpendicular to the directions indicated by arrows 16. In addition, there is provided a fourth routing layer 38 typically comprising a plurality of local routing conductors 40, which typically extend generally parallel to the directions indicated by arrows 16. Vias 42 may extend from local routing conductors 40 to the third routing layer 30, which may lie above or below the fourth routing layer 38.

It is appreciated that the routing layers described in FIGS. 1 and 2A are typically not the only routing layers provided in an integrated circuit constructed and operative in accordance with an embodiment of the present invention. There are typically provided additional routing layers which may or may not participate in the functionality described herein.

Figure 2B:
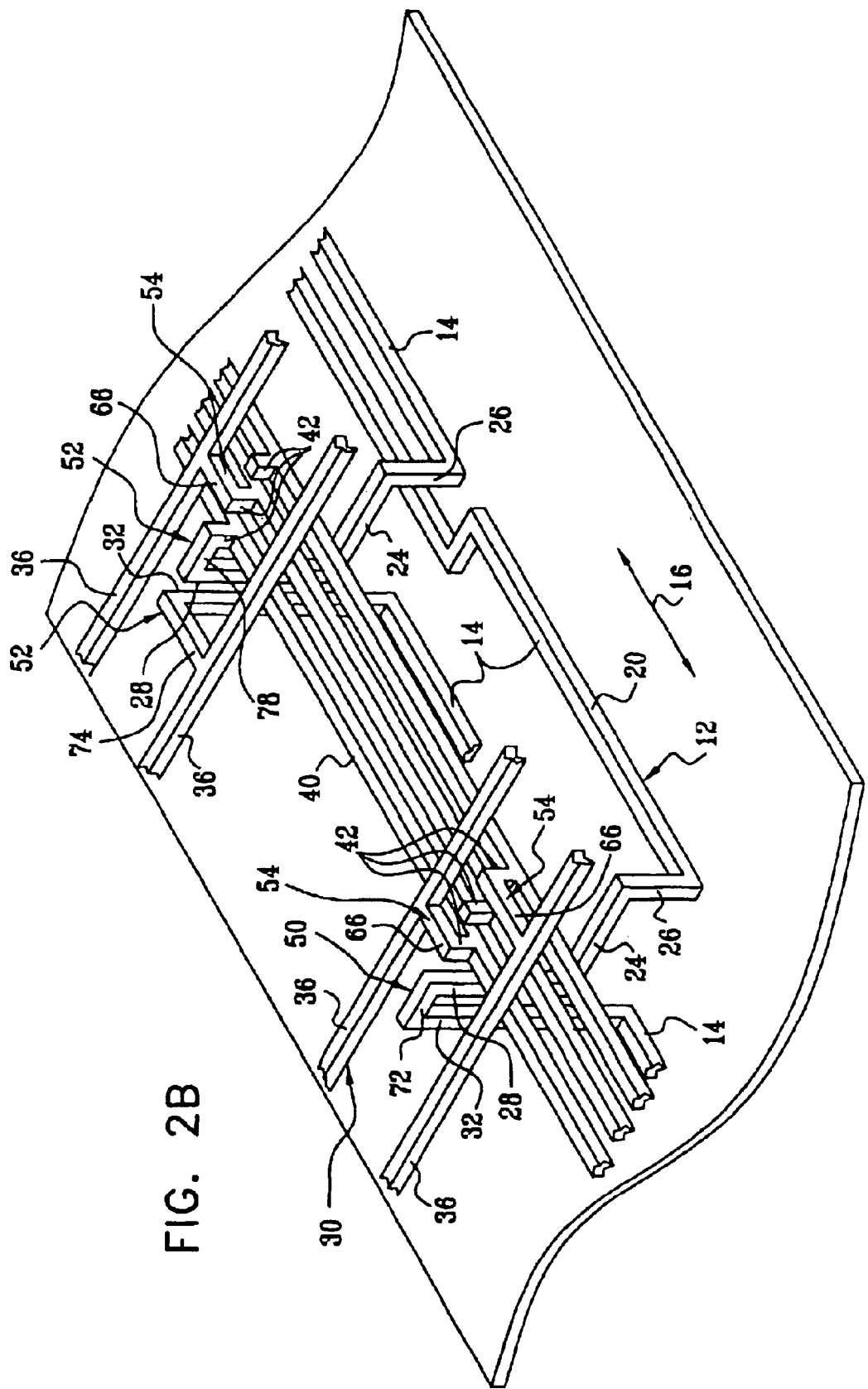
FIG. 2B illustrates the structure of FIG. 2A, which is customized in one of a plurality of possible configurations.

Reference is now made to FIG. 2B, which illustrates the structure of FIG. 2A, which is customized in one of a plurality of possible configurations. The structure of FIG. 2B, which, for convenience is designated using the same reference numerals as used in FIGS. 1 and 2A, with the addition of additional parts of the structure of a customizable integrated circuit constructed and operative in accordance with a preferred embodiment of the present invention.

In the illustrated embodiment of FIG. 2B, a plurality of customizable connections, generally indicated by reference numeral 50, are provided between pairs of the plurality of elongate conductors 14 via individual ones of the plurality of transversely extending conductors and a plurality of customizable connections, generally indicated by reference numeral 52, are provided between individual ones of said plurality of elongate conductors 14 and a plurality of individual ones of said local routing conductors 36 and 40.

Additionally, a plurality of customizable connections, generally indicated by reference numeral 54, are provided between individual ones of said plurality of the local routing conductors 40 and a plurality of individual ones of said local routing conductors 36.

An example of a customizable connection 50 is a connection 72, which connects vias 28 and 32, thus connecting an elongate conductor 14 by means of a transverse conductor 24 and via 28 with another conductor 14, by means of via 32.

An example of a customizable connection 52 is a connection 78, which connects vias 28 and 42, thus connecting an elongate conductor 14 by means of transverse conductor 24 and the via 28 with a local conductor 40 by means of via 42.

Another example of the use of the customizable connection 52 is a connection 74, which connects via 32 and the local routing conductor 36, thus connecting an elongate conductor 14 by means of via 32 and the local conductor 36.

An example of the use of the customizable connection 54 is a connection 66, which connects the local routing conductor 40, by means of the via 42, with the local routing conductor 36.

Reference is made in this connection additionally to FIG. 4, which illustrates seven different connection possibilities, indicated respectively by reference numerals 70, 72, 74, 76, 78, 80 and 82. FIG. 4, which, for convenience is designated using the same reference numerals as used in FIGS. 1–2B, with the addition of additional parts of the structure of a customizable integrated circuit constructed and operative in accordance with a preferred embodiment of the present invention.

Connection possibility 70 provides a customizable connection between an elongate conductor 14 by means of via 32 and a local conductor 40 of a neighboring part of the structure, by means of a via 42. Connection possibility 72 (also shown in FIG. 2B) provides a customizable connection between an elongate conductor 14 by means of via 32 and another elongate conductor 14 by means of a transverse conductor 24 and a via 28. Connection possibility 74 (also shown in FIG. 2B) provides a customizable connection between an elongate conductor 14 by means of via 32 and a local conductor 36. Connection possibility 76 provides a customizable connection between an elongate conductor 14 by means of via 32 and another local conductor 36.

Connection possibility 78 (also shown in FIG. 2B) provides a customizable connection between an elongate conductor 14 by means of a transverse conductor 24 and a via 28 and a local conductor 40 by means of a via 42. Connection possibility 80 provides a customizable connection between an elongate conductor 14 by means of a transverse conductor 24 and a via 28 and the local conductor 36. Connection possibility 82 provides a customizable connection between an elongate conductor 14 by means of a transverse conductor 24 and a via 28 and another local conductor 36.

Figure 3A:
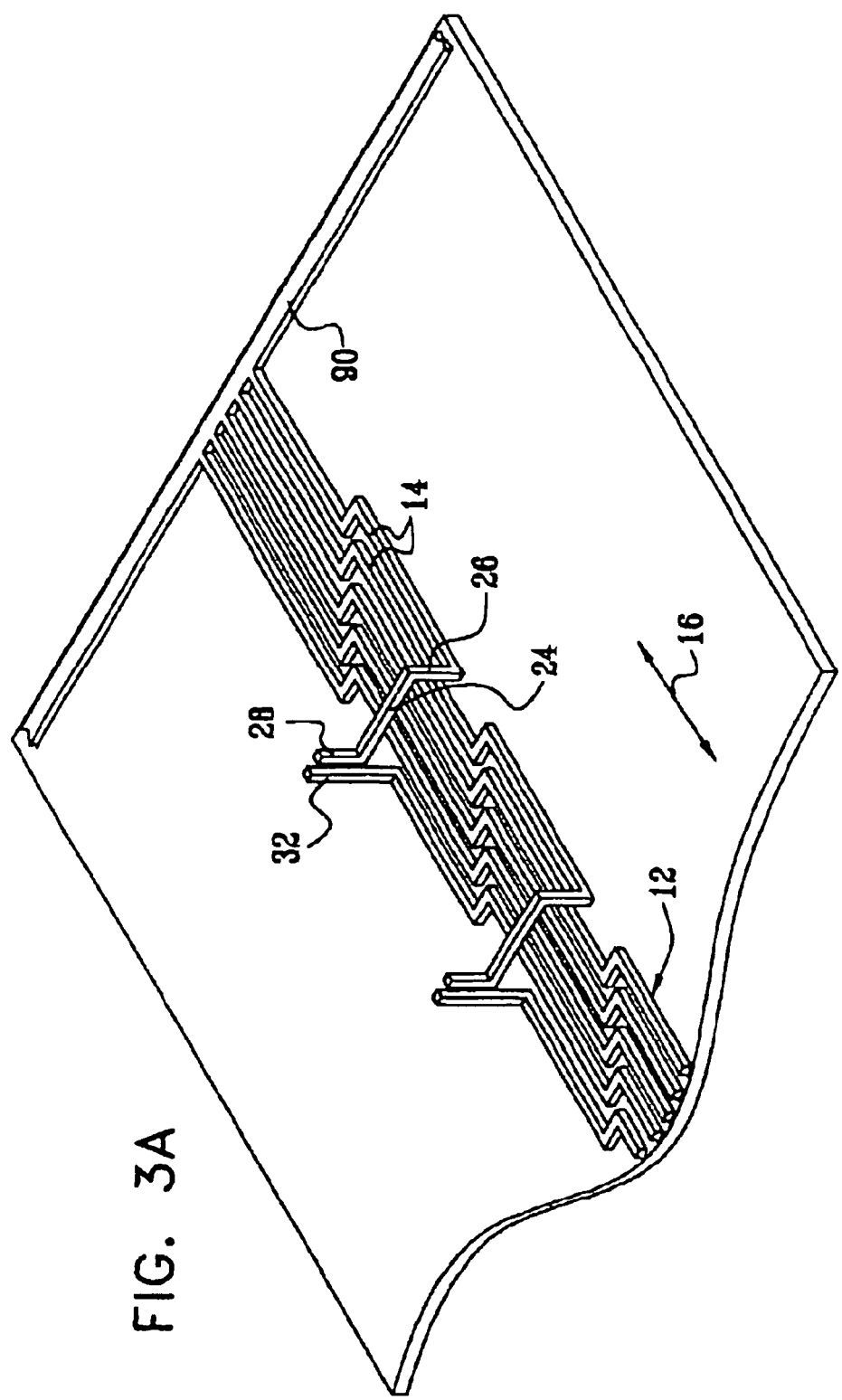
FIG. 3A illustrates the structure of FIG. 1 wherein elongate conductors are connected to ground or to a power line.

Reference is now made to FIG. 3A, which illustrates the structure of FIG. 1 wherein elongate conductors are connected to ground or to a power line, collectively designated by reference numeral 90. It is appreciated that the connection of a given elongate conductor to ground or the power line may be governed by the presence or absence of a connection between vias 28 and 32.

Figure 3B:
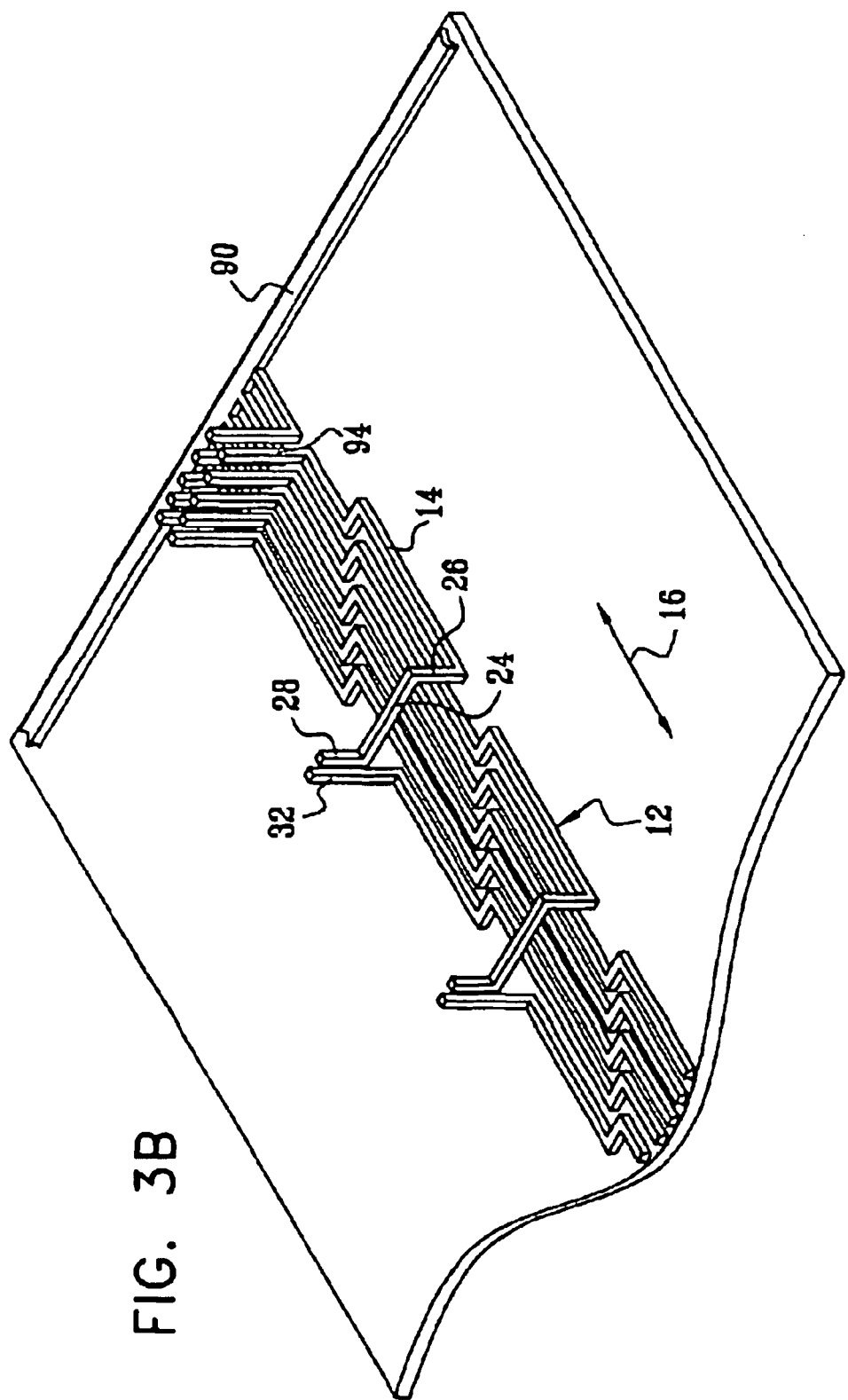
FIG. 3B illustrates the structure of FIG. 2 wherein elongate conductors are formed with customizable connections to ground or to a power line at a centralized location.

Reference is now made to FIG. 3B, which illustrates the structure of FIG. 1 wherein elongate conductors 14 are formed with customizable connections 94 to ground or to a power line 90 at a centralized location, as distinguished from the embodiment of FIG. 3A, wherein the connection of a given elongate conductor to ground or the power line may be governed by the presence or absence of a connection between via pairs 28 and 32, which are distributed along the length of the elongate conductors 14.

It will be appreciated by persons skilled in the art that the present invention is not limited by what has been particularly shown and described hereinabove. Rather the scope of the present invention includes both combinations and sub-combinations of the various features described hereinabove as well as variations and modifications which would occur to persons skilled in the art upon reading the specification and which are not in the prior art.

What is claimed is :

1. A customizable integrated circuit comprising:
   a substrate;
   a plurality of logic units formed on said substrate; and
   a plurality of electrically conducting routing layers formed on said substrate for interconnecting said plurality of logic units, said plurality of electrically conducting routing layers including:
      a first routing layer including a plurality of elongate conductors extending generally in a given direction;
      a second routing layer including a plurality of transversely extending conductors, each adapted for interconnecting a termination of one of said plurality of elongate conductors to a beginning of another one of said plurality of elongate conductors; and
      a third routing layer including:
         a plurality of customizable connections between individual ones of said plurality of elongate conductors and one of a ground line and a power supply line, whereby elongate conductors may serve as anti-crosstalk shields between adjacent other ones of said plurality of elongate conductors.

2. A customizable integrated circuit comprising:
   a substrate;
   a plurality of logic units formed on said substrate; and
   a plurality of electrically conducting routing layers formed on said substrate for interconnecting said plurality of logic units, said plurality of electrically conducting routine layers including:
      a first routing layer including a plurality of elongate conductors extending generally in a given direction;
      a second routing layer including a plurality of transversely extending conductors, each adapted for interconnecting a termination of one of said plurality of elongate conductors to a beginning of another one of said plurality of elongate conductors; and
      at least a third routing layer including;
         a plurality of local routing conductors;
         a plurality of customizable connections between pairs of said plurality of elongate conductors by way of individual ones of said plurality of transversely extending conductors;
         customizable connections between individual ones of said plurality of elongate conductors and a plurality of individual ones of said local routine conductors; and
         a plurality of customizable connections between individual ones of said plurality of elongate conductors and one of a ground line and a power supply line, whereby elongate conductors may serve as anti-crosstalk shields between adjacent other ones of said plurality of elongate conductors.

3. A customizable integrated circuit comprising:
   a substrate;
   a plurality of logic units formed on said substrate; and
   a plurality of electrically conducting routine layers formed on said substrate for interconnecting said plurality of logic units, said plurality of electrically conducting routing layers including:
      a first routine layer including a plurality of elongate conductors extending generally in a given direction;
      a second routing layer including a plurality of transversely extending conductors, each adapted for interconnecting a termination of one of said plurality of elongate conductors to a beginning of another one of said plurality of elongate conductors; and
      at least a third routing layer including:
         a plurality of customizable connections between pairs of said plurality of elongate conductors by way of individual ones of said plurality of transversely extending conductors, said plurality of customizable connections being arranged generally in at least one row, and
         a plurality of customizable connections between individual ones of said plurality of elongate conductors and one of a ground line and a power supply line, whereby elongate conductors may serve as anti-crosstalk shields between adjacent other ones of said plurality of elongate conductors.

4. A customizable integrated circuit comprising:
   a substrate;
   a plurality of logic units formed on said substrate; and
   a plurality of electrically conducting routine layers formed on said substrate for interconnecting said plurality of logic units, said plurality of electrically conducting routine layers including:
      a first routine layer including a plurality of elongate conductors extending generally in a given direction;
      a second routing layer including a plurality of transversely extending conductors, each adapted for interconnecting a termination of one of said plurality of elongate conductors to a beginning of another one of said plurality of elongate conductors; and
      at least a third routing layer including:
         a plurality of local routine conductors;
         a plurality of customizable connections between pairs of said plurality of elongate conductors by way of individual ones of said plurality of transversely extending conductors;

customizable connections between individual ones of said plurality of elongate conductors and a plurality of individual ones of said local routing conductors, and at least a third and a fourth routing layer.

5. A customizable integrated circuit comprising:

a substrate;

a plurality of logic units formed on said substrate; and a plurality of electrically conducting routing layers formed on said substrate for interconnecting said plurality of logic units, said plurality of electrically conducting routine layers including:

a first routine layer including a plurality of elongate conductors extending generally in a given direction;

a second routing layer including a plurality of transversely extending conductors, each adapted for interconnecting a termination of one of said plurality of elongate conductors to a beginning of another one of said plurality of elongate conductors; and at least a third routine layer including:

a plurality of customizable connections between pairs of said plurality of elongate conductors by way of individual ones of said plurality of transversely extending conductors, said plurality of customizable connections being arranged generally in at least one row, and at least a third and a fourth routing layer.

* * * * *